(12) United States Patent
Kelliher et al.

(10) Patent No.: US 9,748,506 B1
(45) Date of Patent: Aug. 29, 2017

(54) SELF-ASSEMBLED MONOLAYER OVERLYING A CARBON NANOTUBE SUBSTRATE

(71) Applicants: James T. Kelliher, Baltimore, MD (US); Monica P. Lilly, Frederick, MD (US); Robert S. Howell, Silver Spring, MD (US); Wayne Stephen Miller, Hanover, MD (US); Patrick B. Shea, Alexandria, VA (US); Matthew J. Walker, Glen Burnie, MD (US); William J. Sweet, Baltimore, MD (US)

(72) Inventors: James T. Kelliher, Baltimore, MD (US); Monica P. Lilly, Frederick, MD (US); Robert S. Howell, Silver Spring, MD (US); Wayne Stephen Miller, Hanover, MD (US); Patrick B. Shea, Alexandria, VA (US); Matthew J. Walker, Glen Burnie, MD (US); William J. Sweet, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/340,499

(22) Filed: Nov. 1, 2016

(51) Int. Cl.
*H01L 29/76* (2006.01)
*H01L 51/05* (2006.01)
*H01L 51/00* (2006.01)

(52) U.S. Cl.
CPC ...... *H01L 51/0533* (2013.01); *H01L 51/0048* (2013.01); *H01L 51/0566* (2013.01)

(58) Field of Classification Search
CPC ............ H01L 51/0533; H01L 51/0566; H01L 51/0048

USPC .................................................... 257/40, 213
See application file for complete search history.

(56) References Cited

U.S. PATENT DOCUMENTS

| 7,714,386 | B2 | 5/2010 | Pesetski et al. | |
|---|---|---|---|---|
| 2006/0135110 | A1 | 6/2006 | Przybysz et al. | |
| 2006/0197076 | A1 | 9/2006 | Adam | |
| 2009/0017571 | A1* | 1/2009 | Nuckolls ................ | B82Y 10/00 438/49 |
| 2011/0165711 | A1* | 7/2011 | Kim ....................... | B82Y 10/00 438/34 |
| 2014/0319461 | A1* | 10/2014 | Park .................... | H01L 51/0048 257/14 |

OTHER PUBLICATIONS

George, et al. "*Surface Chemistry for Molecular Layer Deposition of Organic and Hybrid Organic—Inorganic Polymer*." Accounts of chemical research 42.4 (2009): 498-508.

(Continued)

*Primary Examiner* — David Vu
*Assistant Examiner* — Brandon Fox
(74) *Attorney, Agent, or Firm* — Tarolli, Sunheim, Covell & Tummino LLP

(57) ABSTRACT

One example includes a semiconductor device. The semiconductor device include a carbon nanotube substrate, a self-assembled monolayer, and a gate oxide. The self-assembled monolayer overlies the carbon nanotube substrate and is comprised of molecules each including a tail group, a carbon backbone, and a head group. The gate oxide overlies the self-assembled monolayer, wherein the self-assembled monolayer forms an interface between the carbon nanotube substrate and the gate oxide.

20 Claims, 8 Drawing Sheets

(56) References Cited

OTHER PUBLICATIONS

Lu, et al. "*DNA functionalization of carbon nanotubes for ultrathin atomic layer deposition of high k dielectrics for nanotube transistors with 60 mv/decade switching*" Journal of the American Chemical Society 128.11 (2006): 3518-3519.
Molecular Self-Assembly http://www.sigmaaldrich.com/etc/medialib/docs/Aldrich/Brochure/material_matters_v1n2.Par.0001.File.tmp/material_matters_v1n2.pdf.
Nanoscale Surface Modification http://www.sigmaaldrich.com/etc/medialib/docs/Aldrich/Brochure/al_material_matters_v3n2.Par.0001.File.tmp/al_material_matters_v3n2.pdf.
Organic and Molecular Electronics http://www.sigmaaldrich.com/etc/medialib/docs/Aldrich/Brochure/1/al_material_matters_v4n3.Par.0001.File.tmp/al_material_matters_v4n3.pdf.

\* cited by examiner

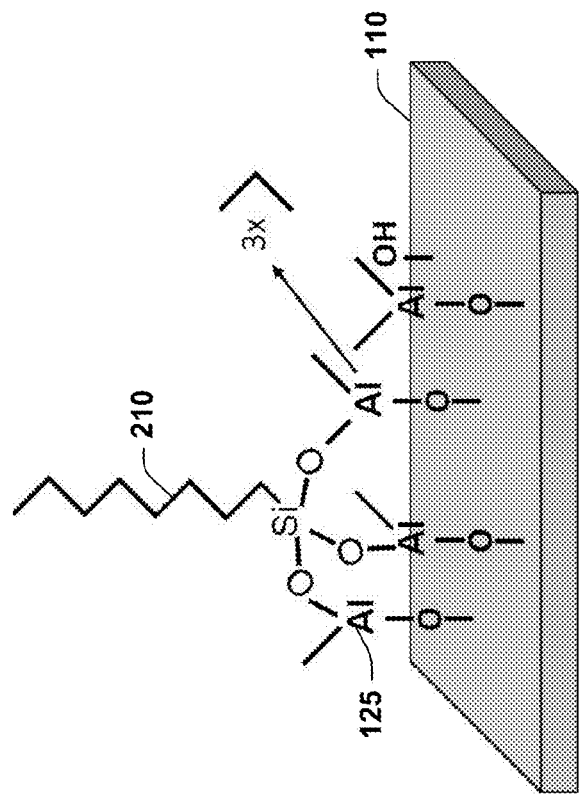
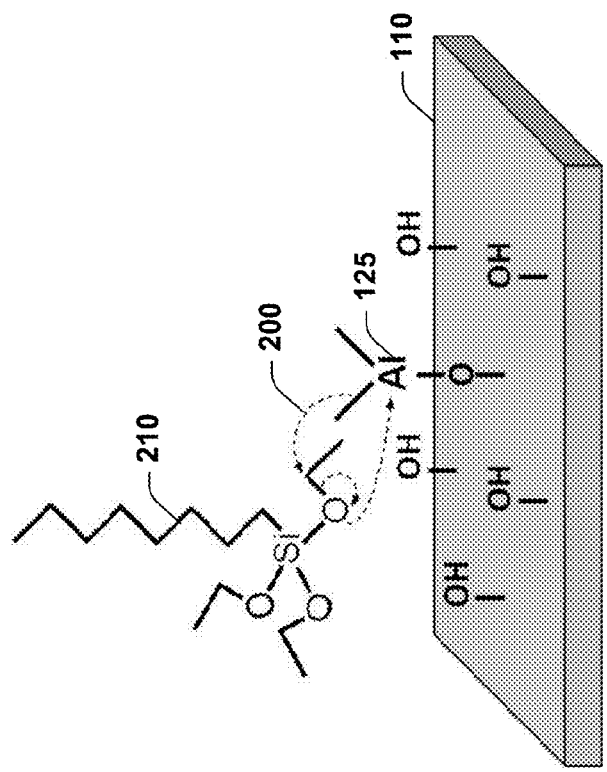
FIG. 2B
FIG. 2A

SELF-ASSEMBLED MONOLAYER OVERLYING A CARBON NANOTUBE SUBSTRATE

TECHNICAL FIELD

This disclosure relates generally to a semiconductor device, and more specifically to a self-assembled monolayer overlying a carbon nanotube substrate.

BACKGROUND

Carbon nanotubes are the one-dimensional form of graphene. Single wall carbon nanotubes have the sp2 bonding structure of graphene, rolled into a single layer, seamless straw. For small diameter tubes, the electronic band structure is effectively one-dimensional, which leads to unique electrical characteristics. A correlation between the density of states and carrier group velocity can yield a transistor that is intrinsically linear, with every step in the gate voltage generating proportional change in the drain current. This leads to a potential to significantly reduce power dissipation.

SUMMARY

One example includes a semiconductor device. The semiconductor device includes a carbon nanotube substrate, a self-assembled monolayer, and a gate oxide. The self-assembled monolayer overlies the carbon nanotube substrate and is comprised of molecules each including a tail group, a carbon backbone, and a head group. The gate oxide overlies the self-assembled monolayer, wherein the self-assembled monolayer forms an interface between the carbon nanotube substrate and the gate oxide.

Another example includes a method of forming a semiconductor device. The method includes forming a carbon nanotube substrate and forming a self-assembled monolayer from a precursor applied to a surface of the carbon nanotube substrate, the self-assembled overlying the carbon nanotube substrate and being comprised of molecules each including a tail group, a carbon backbone, and a head group. The method further includes forming a gate oxide overlying the self-assembled monolayer, wherein the self-assembled monolayer form an interface between the carbon nanotube substrate and the gate oxide.

Another example includes another method of forming a semiconductor device. The method includes applying a precursor to a surface of carbon nanotube substrate, and controlling a hold time of the precursor to provide a time for the precursor to chemically bond to the carbon nanotube substrate and physically transform into a self-assembled monolayer overlying the carbon nanotube substrate, the self-assembled monolayer comprising molecules each including a tail group, a carbon backbone, and a head group. The method further includes overlying a gate oxide onto the self-assembled monolayer, wherein the self-assembled monolayer forms an interface between the carbon nanotube substrate and the gate oxide.

BRIEF DESCRIPTION OF THE DRAWINGS

FIGS. 2A and 2B illustrate an example of a chemical reaction between a precursor and a tether layer of trimethylaluminum (TMA).

DETAILED DESCRIPTION

This disclosure relates generally to a semiconductor device, and more specifically to a self-assembled monolayer overlying a carbon nanotube substrate that includes at least one carbon nanotube. The example carbon nanotube device may be applied to devices that have high dynamic range at low power dissipation. The unique electronic properties of carbon nanotube one-dimensional semiconductors may increase dynamic range of such devices by 10,000×, with no increase in power consumption.

The carbon nanotube device provides for electronics that have low power dissipation, and high dynamic range. The carbon nanotube device includes an interface layer between carbon nanotubes and a high permittivity (high-k) gate oxide that preserves the good electronic properties of the tubes while enabling good adhesion of the gate oxide, allowing for a high-k gate oxide that has low leakage current and high breakdown voltage. The interface layer protects a substrate of the carbon nanotube device from the reactive chemicals used to form the high-k gate oxide.

Figure 1:
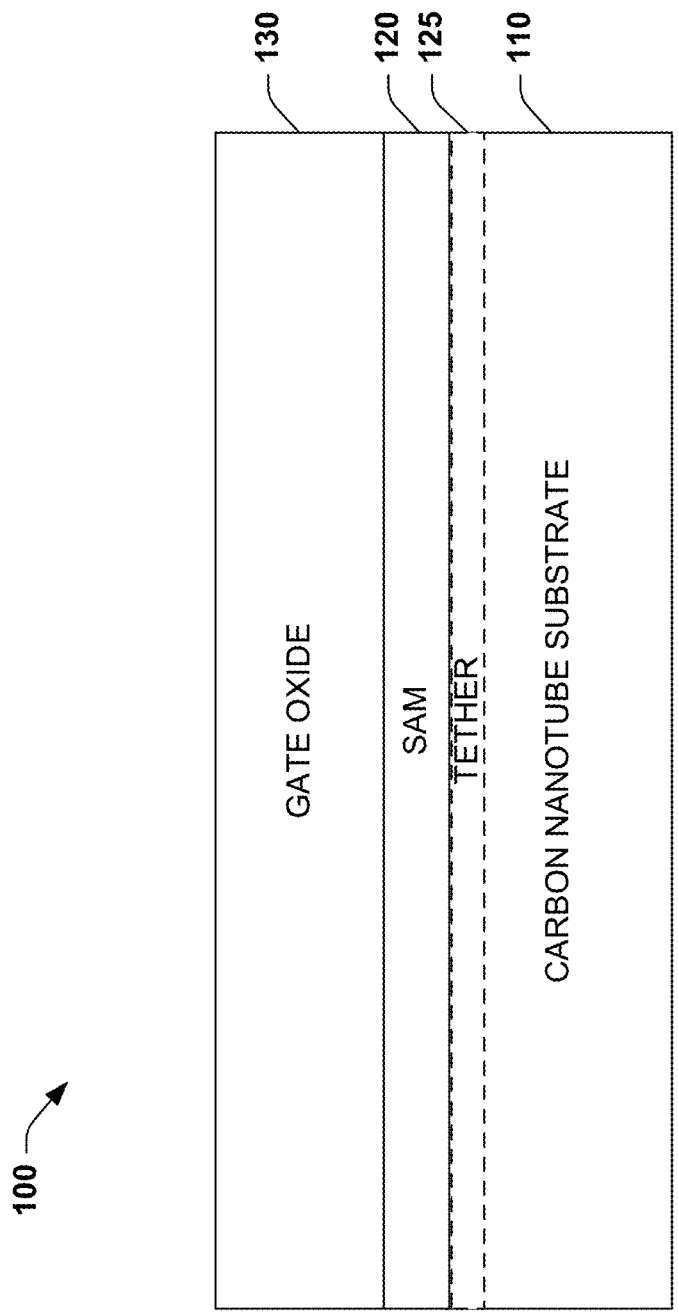
FIG. 1 illustrates an example of a carbon nanotube semiconductor device.

FIG. 1 illustrates an example of a carbon nanotube semiconductor device 100.

The carbon nanotube semiconductor device 100 is comprised of a carbon nanotube substrate 110, a self-assembled monolayer (SAM) 120 formed on a top surface of the carbon nanotube substrate 110, and a gate oxide 130 formed on a top surface of the SAM 120. For example, the gate oxide 130 can be at least a portion of a gate of a transistor device, such as a Field Effect Transistor (FET).

In the example of FIG. 1, the carbon nanotube substrate 110 is demonstrated as a bottom layer of the carbon nanotube semiconductor device 100. The carbon nanotube substrate 110 is comprised of any of a variety of components that include at least one carbon nanotube, chemical mechanical polished (CMP) quartz, thermally oxidized silicon ($SiO_2$), platinum (Pt), and/or any other component(s) that can be used with a carbon nanotube to form a semiconductor device. The carbon nanotube substrate 110, in particular the CMP quartz component, typically includes pinholes and surface traps that form during the formation of the carbon nanotube substrate 110. The SAM 120 overlays these types of surface defects to prevent such surface defects from interfering with the formation and operation of the gate oxide 130.

The SAM 120 is chemically bonded to a top surface of the carbon nanotube substrate 110. In an example, the SAM 120 is formed with a thickness between approximately 1 nm and 2 nm. The SAM 120 is comprised of ordered organic molecules that spontaneously form self-limiting monolayers. Such monolayers of the SAM 120 creates homogenous gate oxide overlay over dissimilar surfaces of the carbon nanotube substrate 110. As discussed above, the carbon nanotube substrate 110 can be comprised of any number of components, with the gate oxide 130 potentially reacting to the different components of the carbon nanotube substrate 110 in different ways, some being detrimental to the carbon nanotube substrate 110. The SAM 120 provides a single material with which the gate oxide 130 will react with during formation thereof, the SAM 120 contacting and providing a protective film over the carbon nanotube substrate 110, while protecting the components of carbon nanotube substrate 110 (e.g., carbon nanotube(s), $SiO_2$, quartz, and platinum) from any reactive chemicals that are used to form the gate oxide 130. The SAM 120 also acts as a bridge from the carbon nanotube substrate 110 to the gate oxide 130, substantially mitigating the interface therebetween and surface traps of the carbon nanotube substrate 110. Such a bridge substantially mitigates I-V hysteresis and leakage current between the carbon nanotube substrate 110 and the gate oxide 130.

The SAM 120 forms an interface between the carbon nanotube substrate 110 and the gate oxide 130. Such an interface is formed from a precursor that is comprised of molecules each having a tail group of atoms attached to a carbon backbone which is attached to a head group of atoms, discussed in more detail below.

In an example, the carbon nanotube semiconductor device 100 may further include a molecular tether material 125. Such a tether material 125 promotes bonding of the SAM 120 to the top surface of the carbon nanotube substrate 110. Such bonding reduces processing time required to produce a high quality SAM 120 on substrate materials that can include $SiO_2$ and quartz. In an example, the tether material 125 is formed on the surface of the carbon nanotube substrate 110 from trimethylaluminum (TMA) material, however any tether material 125 may be employed that aids the SAM 120 to tether to the carbon nanotube substrate 110. Surface hydroxyls on $SiO_2$ and quartz of the carbon nanotube substrate 110 react quickly with the TMA, leaving a layer of methyl- and/or dimethyl-aluminum, which are then available to react with the precursor, the precursor being one or more chemical compounds that react with and/or decompose on the surface of the carbon nanotube substrate 110 to form the SAM 120. Such application of the tether material 125 to the carbon nanotube substrate 110 reduces a time and temperature needed to produce the SAM 120 from the precursor 210.

FIGS. 2A and 2B illustrate an example chemical reaction 200 between a precursor 210 and a tether material 125, the tether material 125 having been already formed on a surface of the carbon nanotube substrate 110 that, as discussed above may include quartz. In the example shown in FIGS. 2A and 2B, the precursor 210 is comprised of Triethoxy (octyl)silate (ODTS). In other examples, the precursor 210 can include Undecanethiol (Thiol) and Trichlorododecylsilane (DTS). The precursor 210 includes one or more of the linear formulas, for example, $CH_3(CH_2)_9CH_2SH$, $CH_3(CH_2)_{10}SH$, $CH_3(CH_2)_{11}SiCl_3$, $CH_3(CH_2)_7Si(OC_2H_5)_3$. ODTS forms a SAM 120 slowly on a quartz surface of the carbon nanotube substrate 110. To accelerate SAM 120 layer formation on such a quartz surface, the tether material 125 is first deposited onto the surface of the carbon nanotube substrate 110. Thereafter, the precursor 210 is applied onto the tether material 125. With such a tether material 125 used to form the SAM 120, the SAM 120 may be formed approximately three times faster than without use of the tether material 125.

As illustrated in FIG. 2A, an aluminum atom from the tether material 125 has a chemical reaction with an oxygen atom of the precursor 210. Multiple such oxygen atoms from the precursor 210 may react with multiple aluminum atoms of the tether material 125. FIG. 2B illustrates the tether material 125 after having formed a chemical bond with the precursor 210. As shown, multipole oxygen atoms from a single precursor 210 molecule can form chemical bonds with multiple aluminum atoms of the tether material 125 on the surface of the carbon nanotube substrate 110. In the example of the precursor 210 being ODTS, three oxygen atoms from the precursor 210 bond with three aluminum atoms of the tether material 125.

Figure 3:
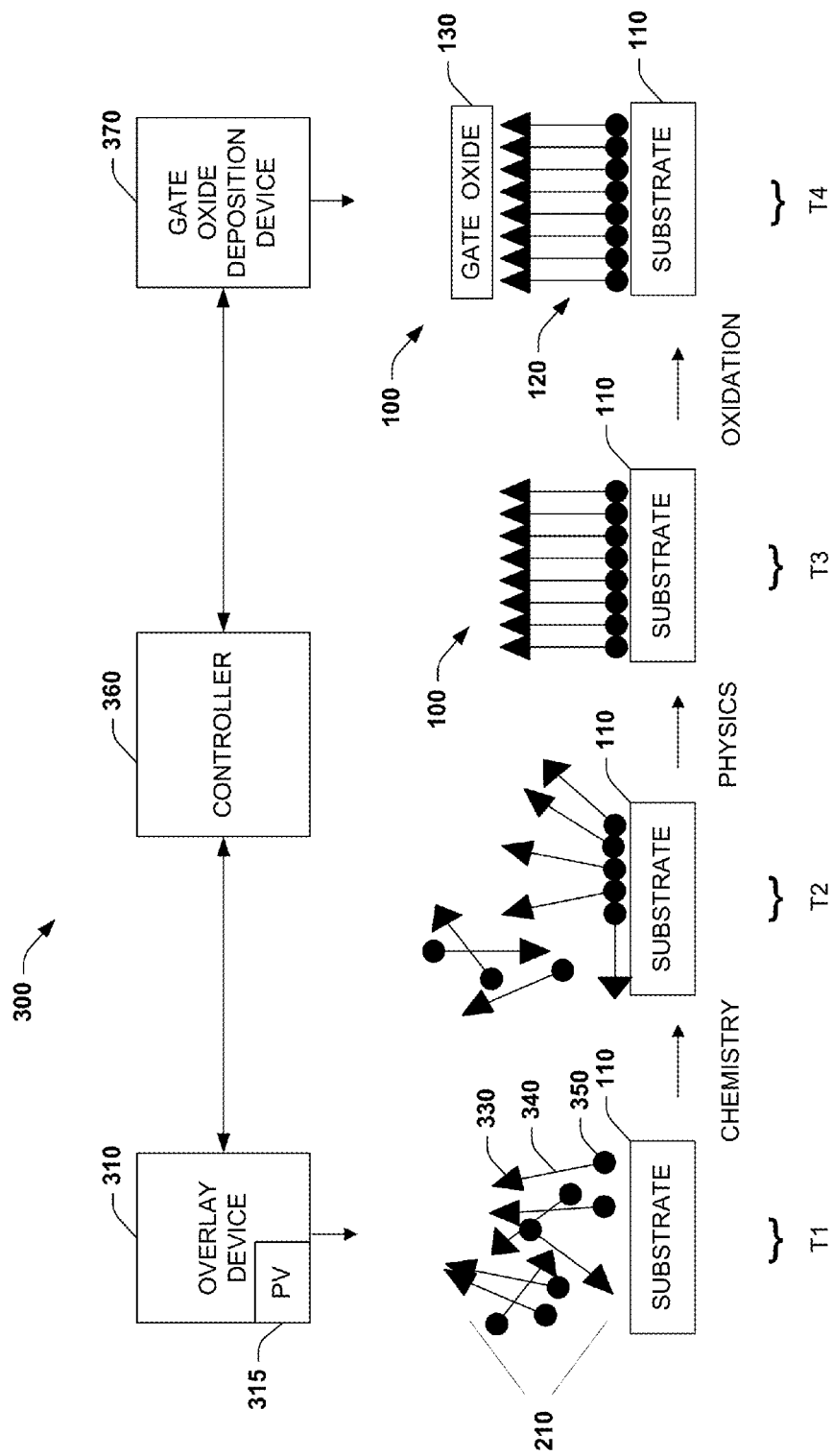
FIG. 3 illustrates an example system for overlaying and aligning molecules of a self-assembled monolayer of the carbon nanotube semiconductor device.

FIG. 3 illustrates an example system 300 for overlaying and aligning molecules of the SAM 120 of the carbon nanotube semiconductor device 100. In an example, the system 300 includes an overlay device 310, a controller 360, and a gate oxide deposition device 370.

The overlay device 310 includes a pressure vessel 315 to pressurize the precursor 210 prior to being introduced to the carbon nanotube substrate 110. The overlay device 310 introduces the pressurized precursor 210 to the carbon nanotube substrate 110 to overlay the precursor 210 onto the carbon nanotube substrate 110. The controller 360 controls operation of the overlay device 310, controlling a temperature at which the precursor 210 is held at during overlay of the SAM 120 on the carbon nanotube substrate 110 and controls a hold time that the precursor 210 is allowed to remain on the carbon nanotube substrate 110.

At a time T1, the overlay device 310 overlays the precursor 210 on a top surface of the carbon nanotube substrate 110. In an example, each of the molecules of the precursor 210 includes a head group 330, a carbon backbone 340, and a tail group 350. The carbon backbone 340 includes carbon chains that connect the head group 330 to the tail group 350, with a number of such carbon chains being proportional to the density of the SAM 120 on the surface of the carbon nanotube substrate 110. The head group 330 and the tail group 350 dictate chemistry and formation behavior of the SAM 120. Initially at time T1, molecules of the precursor 210 are oriented in random directions. Initially, at time T1 the controller 360 instructs the overlay device 310 to release a proper controlled amount of the precursor 210 to the top surface of the carbon nanotube substrate 110 during SAM 120 formation. In an example, the controller 360 instructs the overlay device 310 to set one or more of an internal pressure of chamber and a temperature of the chamber of the overlay device 310 during SAM 120 formation. The controller 360 controls delivery, via the overlay device 310, of the proper controlled amount the precursor 210 to the carbon nanotube substrate 110 under vacuum via control of a vapor pressure of the precursor 210 and a pulse duration of the overlaying. In an example in which the SAM 120 is formed via Atomic Layer Deposition (ALD), the pulse is a cycle in which the precursor 210 reacts with the surface of the carbon nanotube substrate 110 in a self-limiting way, so that the reaction terminates once all reactive sites on the surface of the carbon nanotube substrate 110 are consumed. Multiple such pulses may be used to build the SAM 120 until a uniform thickness is achieved. The controller 360 controls a density of the SAM 120 by increasing a number of such pulses and/or increasing a length of time the SAM 120 is allowed to form on the carbon nanotube substrate 110. In an example, the SAM 120 formed with ALD may be overlaid on the carbon nanotube substrate 110 in approximately thirty minutes. In an example, the SAM 120 formed with ALD may be overlaid on the carbon nanotube substrate 110 at room temperature, while other overlay techniques require curing bakes prior to overlay of the gate oxide 130 to eliminate out-gassing. As a result of implementing ALD for SAM 120 formation, a chamber used to form the SAM 120 is connected to a chamber used to form the gate oxide 130, which eliminates exposure of the carbon nanotube semiconductor device 100 to atmosphere between depositions and which maintains control of the interface formed by the SAM 120. Additionally, an amount of precursor 210 applied to a surface of the carbon nanotube substrate 110 can be better controlled, which allows for more control of a density of the SAM 120 and shorter formation times of the SAM 120 compared with formation times that are possible with immersion and vapor prime.

In an example, the overlay device 310 includes the pressure vessel 315, but depending on the type of overlay being used may also be implemented without the pressure vessel 315. Such a pressure vessel 315 pressurizes the precursor 210 prior to injecting the precursor 210 into the chamber of the overlay device 310 in which the carbon nanotube substrate 110 is loaded for processing. The overlay device 310 utilizes at least one of, for example, spin-on, vapor prime, immersion, ALD, chemical vapor, and/or any other overlay process that allows the SAM 120 to form on the carbon nanotube substrate 110. In an example, the overlay device 310 allows the carbon nanotube substrate 110 to remain under vacuum with no exposure to atmosphere, preventing degradation of the SAM 120 during formation of the SAM 120.

In an example, the precursor 210 includes molecules with polar end groups, for example, —OH, —COOH, and —NH2 terminations. Combinations of SAMs 120 may be used on a single carbon nanotube substrate 110 to provide multiple functionality for such a carbon nanotube substrate 110, where each of such combinations can address separate performance improvements on different areas of the carbon nanotube substrate 110. In an example, prior to the time T1 in which the overlay device 310 applies the precursor 210 on the top surface of the carbon nanotube substrate 110, the overlay device 310 can overlay the tether material 125 onto the carbon nanotube substrate 110 to speed formation of the SAM 120.

At a time T2, molecules of the precursor 210 bond to the top surface of the carbon nanotube substrate 110. Such bonding is dictated by chemistry, and therefore are specific for the carbon nanotube substrate 110 selected to form the carbon nanotube semiconductor device 100. The tail group 350 of the precursor 210 bonds to the top surface of the carbon nanotube substrate 110 including at least one carbon nanotube and any other components of the carbon nanotube substrate 110, leaving the head group 330 and the carbon backbone 340 free to move about the bonded tail group 350. The head group 330 terminates the growth of the SAM 120 and allows the growth of the gate oxide 130 to the SAM 120. The head group 330 modifies the surface of the SAM 120 to be more or less hydrophobic. A hydrophilic SAM 120 provides a consistent growth surface for the gate oxide 130 that accelerates nucleation and increases uniformity of overlaying films on the SAM 120. In an example, the deposition device 310, under control of the controller 360, pulses the head group 330 with water and/or oxygen to assist in termination of the head group 330.

At a time T3, molecules of the precursor 210 align substantially vertically on and perpendicular to the top surface of the carbon nanotube substrate 110. Such alignment is dictated by physics with molecules of the precursor 210 automatically aligning themselves over time. Ideally, all of the molecules of the precursor 210 align in a substantially vertical direction to form a dense, well packed SAM 120, with the tail group 350 of such molecules of the precursor 210 forming a uniform coating on the top of the carbon nanotube substrate 110. However, less than all of the molecules of the precursor 210 may align in the vertically on and perpendicular to the top surface of the carbon nanotube substrate 110 to obtain the numerous benefits of the SAM 120. Thus, the overlay device 310, under control of the controller 360, forms the SAM 120 as an interface onto which the gate oxide 130 can thereafter be formed. For example, such an interface can withstand ALD up to 120 degrees Celsius.

The controller 360 controls an exposure of the carbon nanotube substrate 110 to the precursor 210, the exposure being a function of a dose time and a hold time, the dose time being a time that the carbon nanotube substrate 110 is exposed to the precursor 210. The hold time provides a time for the precursor 210 to chemically bond to the carbon nanotube substrate 110 and physically transform into the SAM 120. The controller 360 controls a pulse length of the precursor 210 during ALD. Thereafter, the controller 360 controls a hold time in which a chamber of the overlay device 310 is isolated from a pump, allowing the molecules of the precursor 210 to diffuse around the chamber and rearrange on the carbon nanotube substrate 110 to form the SAM 120. In an example, the controller 360 tests the surface of the SAM 120 to measure a degree of hydrophobic behavior of the SAM 120, determining whether the surface thereof is more or less hydrophobic, discussed in more detail in related to FIG. 4B.

At a time T4, the controller 360 controls the gate oxide deposition device 370 to overlie the gate oxide 130 on the SAM 120. Thus, overlay of the gate oxide 130 on the SAM 120 eliminates problems discussed above associated with overlay of the gate oxide 130 directly on the carbon nanotube substrate 110.

Figure 4A:
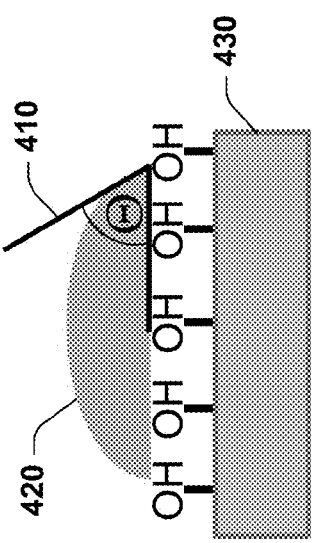
FIGS. 4A and 4B illustrate an example hydrophilic surface of silicon oxide and an example hydrophobic surface of a self-assembled monolayer.
Figure 4B:
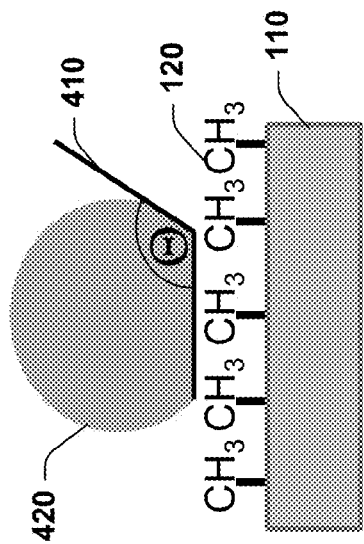

FIGS. 4A and 4B illustrate an example hydrophilic surface of silicon oxide and an example hydrophobic surface of SAM 120. As shown in FIG. 4A, a liquid bead 420 (e.g., water) is placed on a top surface of a silicon oxide substrate 430 that lacks a SAM 120 overlay. Such a liquid bead 420 on the silicon oxide substrate 430 results in the liquid bead 420 spreading out across the surface thereof to produce a small (e.g., less than 70 degrees) water contact angle (WCA) 410. Such a WCA 410 provides a measurement of average surface energy on the silicon oxide substrate 430, with the silicon oxide substrate 430 having low average surface energy and having a hydrophilic surface. In contrast to the silicon oxide substrate 430 shown in FIG. 4A, FIG. 4B shows a liquid bead 420 that is placed on a top surface of a SAM 120 overlay. Such a liquid bead 420 on the SAM 120 results in the liquid bead 420 forming a sphere on the surface thereof to produce a large (e.g., greater than 70 degrees) WCA 410. Such a WCA 410 for a liquid bead 420 placed on the surface of the SAM 120 indicates that the SAM 120 has high average surface energy and has a hydrophobic surface. Such a hydrophobic surface of the SAM 120 provides an improved surface to which the gate oxide 130 is thereafter formed.

Figure 5:
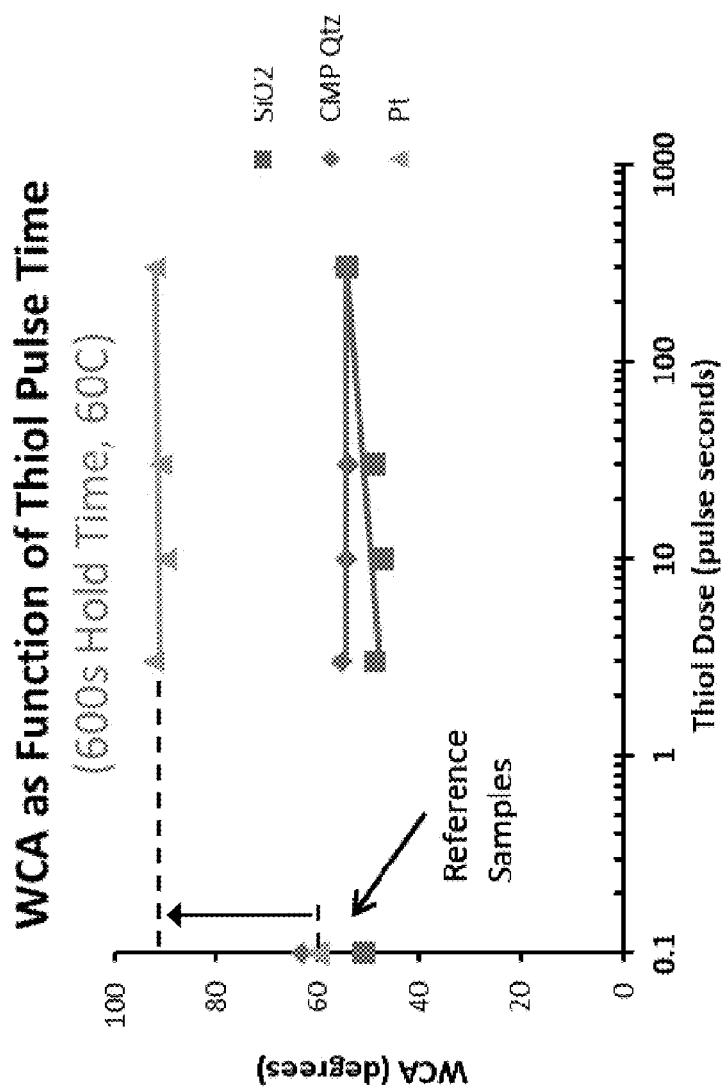
FIG. 5 illustrates an example of water contact angle test results for Thiol precursor as a function of pulse time.

FIG. 5 illustrates example WCA 410 test results for Thiol precursor 210 as a function of pulse time. For the results shown in FIG. 5, Thiol is dosed in a chamber of the overlay device 310 for various pulse lengths. Thereafter, the chamber is subject to a fixed 600 second "hold" at 60 degrees Centigrade, where the chamber of the overlay device 310 is isolated from the pump of the overlay device 310 to allow the Thiol molecules to diffuse around the chamber and rearrange on the surface of the various samples being tested. In the example shown in FIG. 5, the samples include thermally oxidized silicon ($SiO_2$), chemical mechanical polished (CMP) quartz, and platinum (Pt). Even with a short three second dose of Thiol, the test results for Pt illustrate that the WCA 410 increases approximately 30 degrees versus an uncoated control substrate of Pt, with no change in the WCA 410 for CMP quartz or $SiO_2$.

Figure 6:
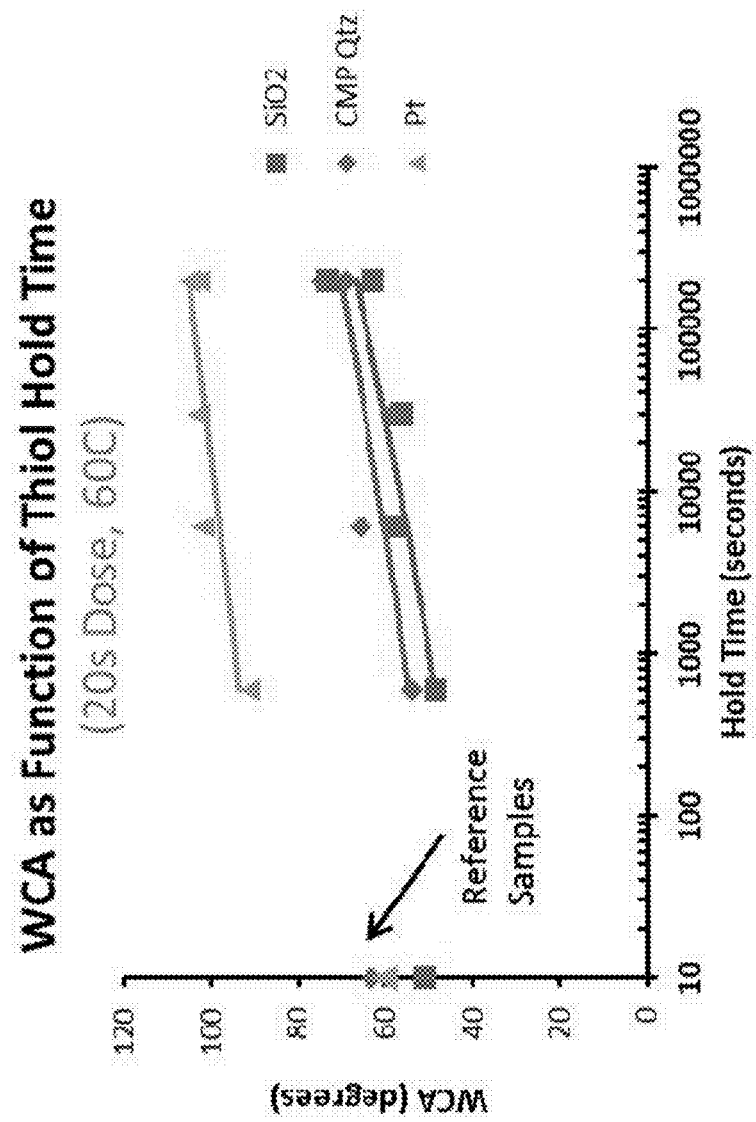
FIG. 6 illustrates an example of water contact angle test results for Thiol precursor as a function of hold time.

FIG. 6 illustrates example WCA 410 test results for Thiol precursor 210 as a function of hold time. For the results shown in FIG. 6, Thiol is dosed in a chamber of the overlay device 310 for 20 seconds at 60 degrees Centigrade. Thereafter, the chamber of the overlay device 310 is isolated from the pump of the overlay device 310 to allow the Thiol molecules to diffuse around the chamber and onto the surface of the various samples being tested for various hold times. In the example shown in FIG. 6, the samples include thermally oxidized silicon ($SiO_2$), chemical mechanical polished (CMP) quartz, and platinum (Pt). Thiol is shown to quickly produce a WCA 410 change on Pt surfaces, even for short hold times. Extended exposure of each of the different substrates, thermally oxidized $SiO_2$, CMP quartz, and Pt, increases the WCA 410 at similar rates. Even with a short three second dose of Thiol, the test results for Pt illustrate that the WCA 410 again increases approximately 30 degrees versus an uncoated control substrate of Pt. In contrast to the test results shown in FIG. 5 based on pulse times, the test results of FIG. 6 show that the WCA 410 for each of the different substrates, thermally oxidized $SiO_2$, CMP quartz, and Pt, increases as hold times increase.

Figure 7:
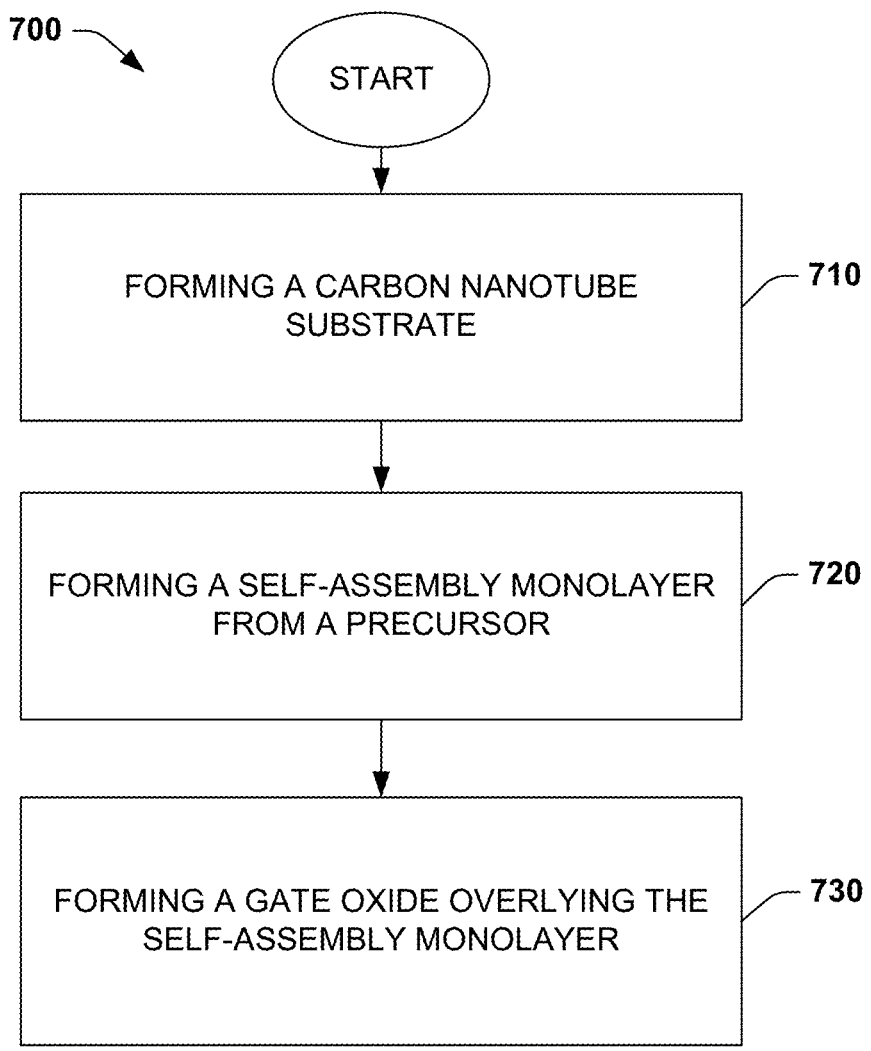
FIG. 7 illustrates an example of a method for forming the carbon nanotube semiconductor device.
Figure 8:
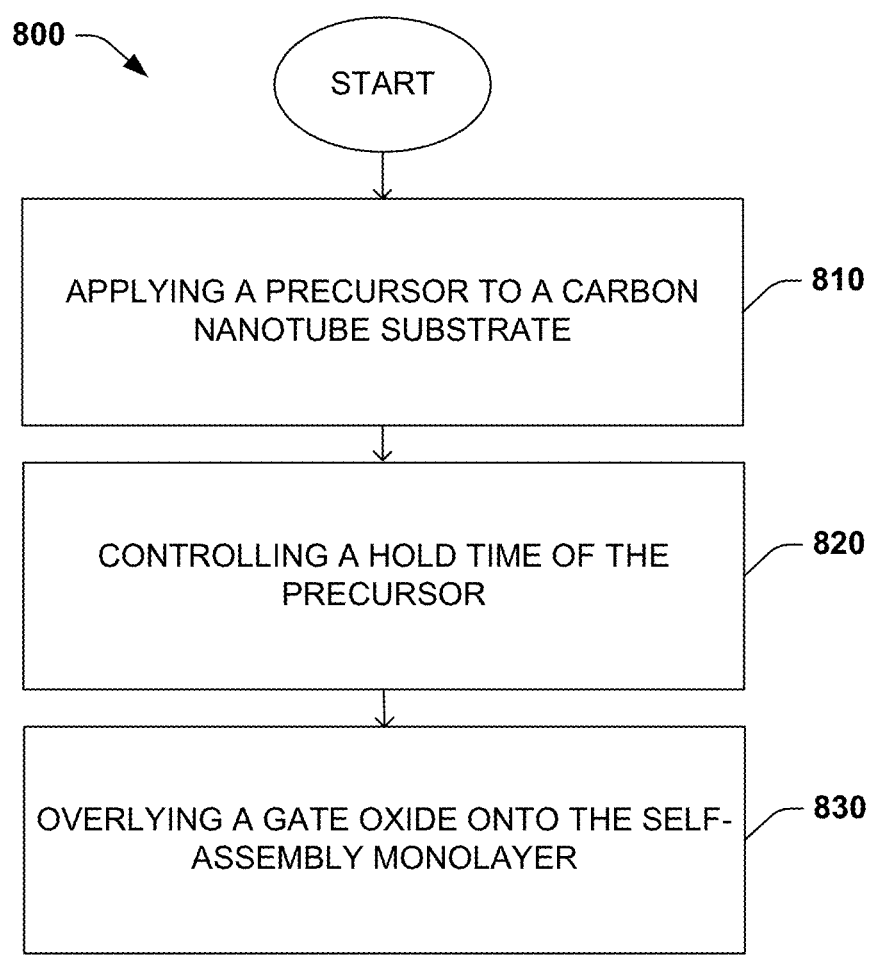
FIG. 8 illustrates an example of another method for forming the carbon nanotube semiconductor device.

In view of the foregoing structural and functional features described above, a method in accordance with various aspects of the present disclosure will be better appreciated with reference to FIGS. 7 and 8. While, for purposes of simplicity of explanation, the methods of FIGS. 7 and 8 are shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure. Moreover, for simplicity of explanation, the methods of FIGS. 7 and 8 can include additional functional features not discussed, with FIGS. 7 and 8 being described with reference to the examples illustrated herein.

FIG. 7 illustrates an example of a method 700 of forming the carbon nanotube semiconductor device 100. At 710, carbon nanotube substrate 110 is formed. At 720, the SAM 120 is formed from the precursor 210, the SAM 120 overlying the carbon nanotube substrate 110. The SAM 120 is formed when the tail group 350 chemically bonds to the top surface of the carbon nanotube substrate 110, and the carbon backbones 340 and the head groups 330 of molecules of the precursor 210 line up substantially in parallel with respect to each other and substantially perpendicular to the carbon nanotube substrate 110. At 730, the gate oxide 130 is formed overlying the SAM 120. The controller 360 controls processes needed to form the SAM 120 on the surface of the carbon nanotube substrate 110 and control the processes needed to overlie the gate oxide 130 onto the SAM 120. Thus, the SAM 120 forms an interface between the carbon nanotube substrate 110 and the gate oxide 130.

FIG. 8 illustrates another example of a method 800 of forming the carbon nanotube semiconductor device 100. At 810, the precursor 210 is applied to the carbon nanotube substrate 110. The controller 360 controls the overlay device 310 to apply the proper controlled amount of the precursor 210 to the top surface of the carbon nanotube substrate 110. At 820, a hold time of the precursor 210 is controlled to provide a time for the precursor 210 to chemically bond to the carbon nanotube substrate 110 and physically transform into the SAM 120 overlying the carbon nanotube substrate 110. The controller 360 selects an optimal hold time based on the particular SAM 120 selected, the material makeup of the carbon nanotube substrate 110, for example whether the carbon nanotube substrate 110 includes CMP quartz, thermally oxidized $SiO_2$, and/or platinum. At 830, the gate oxide 130 is overlaid onto the SAM 120. The controller 360 controls processes needed to form the SAM 120 on the surface of the carbon nanotube substrate 110 and control the processes needed to overlie the gate oxide 130 onto the SAM 120. Thus, the SAM 120 forms an interface between the carbon nanotube substrate 110 and the gate oxide 130.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A semiconductor device, comprising:
   a carbon nanotube substrate;
   a self-assembled monolayer overlying the carbon nanotube substrate, the self-assembled monolayer comprising molecules each including a tail group, a carbon backbone, and a head group; and
   a gate oxide overlying the self-assembled monolayer, wherein the self-assembled monolayer forms an interface between the carbon nanotube substrate and the gate oxide.

2. The semiconductor device of claim 1, wherein the tail group is chemically bonded to a surface of the carbon nanotube substrate to form the self-assembled monolayer.

3. The semiconductor device of claim 1, wherein the self-assembled monolayer comprises molecules of a precursor that are applied to a surface of the carbon nanotube substrate, such that the molecules of the precursor are aligned substantially perpendicular with respect to the carbon nanotube substrate and substantially in parallel with respect to each other.

4. The semiconductor device of claim 1, further comprising a tether material that tethers the self-assembled monolayer to the carbon nanotube substrate.

5. The semiconductor device of claim 1, wherein the self-assembled monolayer is formed from a precursor comprising at least one of Undecanethiol (Thiol), Trichlorododecylsilane (DTS) and Triethoxy(octyl)silane (ODTS).

6. The semiconductor device of claim 1, wherein semiconductor device is a Field Effect Transistor (FET).

7. The semiconductor device of claim 1, wherein the carbon nanotube substrate further comprises at least one of chemical mechanical polished quartz, thermally oxidized silicon, and platinum.

8. A method, comprising:
   forming a carbon nanotube substrate;
   overlaying a precursor on a surface of the carbon nanotube substrate to form a self-assembled monolayer, the precursor comprising molecules each including a tail group, a carbon backbone, and a head group; and overlaying a gate oxide on the self-assembled monolayer, wherein the self-assembled monolayer forms an interface between the carbon nanotube substrate and the gate oxide.

9. The method of claim 8, wherein overlaying the precursor comprises overlaying the precursor to the carbon nanotube substrate via at least one of spin-on, vapor prime, immersion, and Atomic Layer Deposition (ALD).

10. The method of claim 8, wherein forming the carbon nanotube substrate comprises forming the carbon nanotube substrates from at least one of chemical mechanical polished quartz, thermally oxidized silicon, and platinum.

11. The method of claim 8, further comprising controlling a hold time to provide a time for alignment of molecules of the precursor to be substantially perpendicular with respect to the carbon nanotube substrate and substantially in parallel with respect to each other, to form the self-assembled monolayer.

12. The method of claim 8, further comprising overlaying a tether material layer on the carbon nanotube substrate, wherein overlaying the precursor comprises overlaying the precursor on a surface of the tether material layer to form the self-assembled monolayer.

13. The method of claim 8, wherein the precursor comprises at least one of Undecanethiol (Thiol), Trichlorododecylsilane (DTS) and Triethoxy(octyl)silane (ODTS).

14. The method of claim 8, further comprising delivering the precursor to the carbon nanotube substrate under vacuum via control of a vapor pressure of the precursor and a pulse duration of the precursor.

15. A method, comprising:
applying a precursor to a surface of a carbon nanotube substrate, the precursor comprising molecules each including a tail group, a carbon backbone, and a head group;
controlling a hold time of the precursor to provide a time for the precursor to chemically bond to the carbon nanotube substrate and physically transform into a self-assembled monolayer overlying the carbon nanotube substrate; and
overlaying a gate oxide onto the self-assembled monolayer, wherein the self-assembled monolayer forms an interface between the carbon nanotube substrate and the gate oxide.

16. The method of claim 15, wherein the precursor is applied to the carbon nanotube substrate via at least one of spin-on, vapor prime, immersion, and Atomic Layer Deposition (ALD).

17. The method of claim 15, wherein forming the carbon nanotube substrate comprises forming the carbon nanotube substrates from at least one of chemical mechanical polished quartz, thermally oxidized silicon, and platinum.

18. The method of claim 15, wherein controlling the hold time comprises controlling the hold time to control an alignment of molecules of the precursor to be substantially perpendicular with respect to the carbon nanotube substrate and substantially in parallel with respect to each other, to form the self-assembled monolayer.

19. The method of claim 15, further comprising overlaying a tether material layer on the carbon nanotube substrate, wherein overlaying the precursor comprises overlaying the precursor on a surface of the tether material layer to form the self-assembled monolayer.

20. The method of claim 15, wherein the precursor comprises at least one of Undecanethiol (Thiol), Trichlorododecylsilane (DTS) and Triethoxy(octyl)silane (ODTS).

* * * * *